(12) United States Patent
Sandstrom et al.

(10) Patent No.: US 7,705,963 B2
(45) Date of Patent: Apr. 27, 2010

(54) PUPIL IMPROVEMENT OF INCOHERENT IMAGING SYSTEMS FOR ENHANCED CD LINEARITY

(75) Inventors: Torbjorn Sandstrom, Pixbo (SE); Igor Ivonin, Gothenburg (SE)

(73) Assignee: Micronic Laser Systems AB, Taby (SE)

( * ) Notice: Subject to any disclaimer, the term of this patent is extended or adjusted under 35 U.S.C. 154(b) by 1214 days.

(21) Appl. No.: 11/209,040

(22) Filed: Aug. 23, 2005

(65) Prior Publication Data
US 2006/0054781 A1 Mar. 16, 2006

Related U.S. Application Data

(60) Provisional application No. 60/603,275, filed on Aug. 23, 2004.

(51) Int. Cl.
*G03B 27/42* (2006.01)
*G06F 17/50* (2006.01)
*G06K 9/00* (2006.01)
*G01N 21/86* (2006.01)

(52) U.S. Cl. .................. 355/53; 355/67; 355/71; 355/74; 716/2; 716/19; 716/21; 430/5; 430/8; 430/9; 382/141; 382/144; 250/559.05; 250/559.06

(58) Field of Classification Search .............. 355/53, 355/67, 71, 74; 716/2, 19, 21; 430/5, 8, 430/9; 382/141, 144; 250/559.05, 559.06
See application file for complete search history.

(56) References Cited

U.S. PATENT DOCUMENTS

| | | | |
|---|---|---|---|
| 4,455,485 | A | 6/1984 | Hosaka et al. |
| 5,327,338 | A | 7/1994 | Allen et al. |
| 5,393,987 | A | 2/1995 | Abboud et al. |
| 5,495,279 | A | 2/1996 | Sandstrom |
| 5,635,976 | A | 6/1997 | Thuren et al. |
| 6,428,940 | B1 | 8/2002 | Sandstrom |
| 6,448,999 | B1 | 9/2002 | Utterback et al. |
| 6,624,880 | B2 | 9/2003 | Sandstrom et al. |
| 6,700,600 | B1 | 3/2004 | Sandstrom et al. |
| 6,717,097 | B1 | 4/2004 | Sandstrom et al. |
| 6,816,302 | B2 | 11/2004 | Sandstrom et al. |
| 6,833,854 | B1 | 12/2004 | Sandstrom |
| 6,844,123 | B1 | 1/2005 | Ekberg et al. |
| 6,883,158 | B1 | 4/2005 | Sandstrom et al. |

(Continued)

OTHER PUBLICATIONS

Van de Nes, A. S. et al. "Calculation of the vectorial field distribution in a stratified focal region of a high numerical aperture imaging system." Optics Express, vol. 12, No. 7; Apr. 5, 2004; pp. 1281-1293.

(Continued)

*Primary Examiner*—Evelyn A. Lester
(74) *Attorney, Agent, or Firm*—Harness, Dickey & Pierce, P.L.C.

(57) ABSTRACT

A pattern generator may include an electromagnetic radiation source and an optical system. The electromagnetic radiation source may emit electromagnetic radiation to create a pattern on a workpiece. The optical system may include an optical path for the electromagnetic radiation emitted from the electromagnetic radiation source and may be configured such that an apodization of the electromagnetic radiation is sufficient to optimize a critical dimension linearity for the created pattern.

33 Claims, 7 Drawing Sheets

U.S. PATENT DOCUMENTS 6,912,323 B2    6/2005    Copeland et al.
2005/0112474 A1    5/2005    Sandstrom
2005/0151949 A1*    7/2005    Eib et al. ..................... 355/67

OTHER PUBLICATIONS

Biss, D. P. et al. "Cylindrical vector beam focusing through a dielectric interface." Optics Express, vol. 9, No. 10; Nov. 5, 2001; pp. 490-497.

Van de Nes, A. S. et al. "Cylindrical vector beam focusing through a dielectric interface: comment." Optics Express, vol. 12, No. 5; Mar. 8, 2004; pp. 967-969.

Porras, Miguel A. "The best quality optical beam beyond the paraxial approximation." Optics Communications 111 (1994); pp. 338-349.

Igor Ivonin et al., "Pupil Optimization of Incoherent Imaging Systems for Improved CD Linearity", 2004:SPIE-The international Society for Optical Engineering.

* cited by examiner

Eigenvalues

PUPIL IMPROVEMENT OF INCOHERENT IMAGING SYSTEMS FOR ENHANCED CD LINEARITY

PRIORITY STATEMENT

This U.S. non-provisional patent application claims priority under 35 U.S.C. § 120 of U.S. provisional Application provisional U.S. patent application Ser. No. 60/603,275 filed on Aug. 23, 2004 the entire contents of which are incorporated herein by reference.

BACKGROUND OF THE INVENTION

In microlithography, critical dimension (CD) linearity error may be of greater importance than, for example, other light beam characteristics, such as, optical resolution. CD linearity error is a measurement of the amount an actual CD of a printed image deviates from an expected or target CD.

The CD linearity errors for a conventional optical imaging system may be dependent on an optical beam waist and/or side lobes in the focal spot. The side lobes may also affect corners and other 2D features. Thus, reduction in CD linearity errors may improve image fidelity.

A proper balance between the optical beam waist and the intensity of side lobes may be dependent on a CD linearity error threshold and may be achieved by optical beam apodization.

Apodization (e.g., optimization of the pupil function), is well-known in optics, but is conventionally used to reduce (e.g., minimize) the width of the central lobe (e.g., beam waist). However, for example, if the central lobe is reduced in excess, CD linearity may be affected by the intensity of side lobes, which may cause the stray light appearance in a printed image and/or may result in an increase in CD linearity error.

SUMMARY OF THE INVENTION

Example embodiments of the present invention provide improved image fidelity and/or CD linearity. CD linearity may be used as a metric of the image and/or as a measure of the improvement.

Example embodiments of the present invention provide improved and/or optimized pupil function for improving CD linearity using lower numerical aperture (NA) scalar and/or higher NA vector model. In an example embodiment of the present invention, a Gaussian beam may be truncated and the pupil function may be improved (e.g., optimized). In an example embodiment, the side lobes of the Gaussian beam may be suppressed, for example, by reducing the size of the Gaussian beam such that the Gaussian beam may be smaller than the pupil.

In another example embodiment of the present invention, a high-NA vector may suppress (e.g., eliminate) edge acuity loss, for example, because of the higher contrast and/or better depth of focus with the higher NA vector and improved pupil. In example embodiments of the present invention, the improved and/or optimized pupil may improve CD linearity and/or depth of focus.

Example embodiments of the present invention may provide increased beam apodization to improve (e.g., optimize) CD linearity curve, for example, regardless of the increase in optical beam waist size. One or more example embodiments of the present invention may be used to produce and/or manufacture, for example, a processor, a memory and/or memory circuit, or any other integrated circuit (IC).

An example embodiment of the present invention provides a pattern generator which includes an electromagnetic radiation source and an optical system. The electromagnetic radiation source may emit electromagnetic radiation to create a pattern on a workpiece. The optical system may include an optical path for the electromagnetic radiation emitted from the electromagnetic radiation source and may be configured such that an apodization of the electromagnetic radiation is sufficient to optimize a critical dimension linearity for the created pattern.

An example embodiment of the present invention provides a method including applying an apodized intensity of electromagnetic radiation after (e.g., immediately after) a system aperture in an optical path of a pattern generator and creating a spot function with less than 0.8% percent outside of a center lobe.

In example embodiments of the present invention, the optical system may be a partially incoherent imaging system, may have multiple raster-scanning beams and/or may use immersion.

In example embodiments of the present invention, the optical system may further include a system aperture for creating a spot function with less than 0.8% percent outside of a center lobe component of the electromagnetic radiation. In example embodiments of the present invention, the optical system may include a system aperture for creating a spot function with less than 2 percent outside of a center lobe component of the electromagnetic radiation In example embodiments of the present invention, the system aperture may have a numerical aperture (NA) greater than or equal to about 0.68. In example embodiments of the present invention, the electromagnetic radiation may be a light beam with a polarization that varies across an exit pupil. In example embodiments of the present invention, the distribution of the light beam may be radially non-monotonic and may include concentric rings with higher and lower intensities.

In example embodiments of the present invention, the optical system may further include a first lens positioned such that an apodization of the electromagnetic radiation is sufficient to optimize a critical dimension linearity for the created pattern, a modulator modulating electromagnetic radiation emitted from the electromagnetic radiation source to create a pattern, a scanner for relaying the electromagnetic radiation toward the workpiece, and a second lens for focusing the electromagnetic radiation such that the electromagnetic radiation impinges on the workpiece to create the pattern.

In example embodiments of the present invention, apodization of the light beam may be provided by a filter, which may be an amplitude pupil filter having an aperture size determined based on a wavelength of the light beam.

In example embodiments of the present invention, the optical system may include a system aperture having a numerical aperture, and a critical dimension and critical dimension linearity error for the pattern generator may be determined based on the wavelength of the electromagnetic radiation and a size of the numerical aperture.

In example embodiments of the present invention, the light beam may have a wavelength of greater than, or equal to, about 32 nm, for example, about 413 nm, about 406 nm, about 364 nm, about 257 nm, about 198 nm, about 193 nm and/or may have a beam width less than 0.3 times the size of the system aperture. In example embodiments of the present invention, the electromagnetic radiation and/or light beam may have a Gaussian shape.

In example embodiments of the present invention, the modulator may be an acousto-optical or electro-optical modulator.

In example embodiments of the present invention, the optical system may further include a spatial light modulator having a plurality of pixels for creating a pattern and for relaying electromagnetic radiation such that the electromagnetic radiation impinges on the workpiece and/or a filter for filtering the electromagnetic radiation such that the apodization of the electromagnetic radiation is sufficient to optimize a critical dimension linearity for the created pattern.

BRIEF DESCRIPTION OF THE DRAWINGS

Example embodiments of the present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS OF THE PRESENT INVENTION

Figure 1:
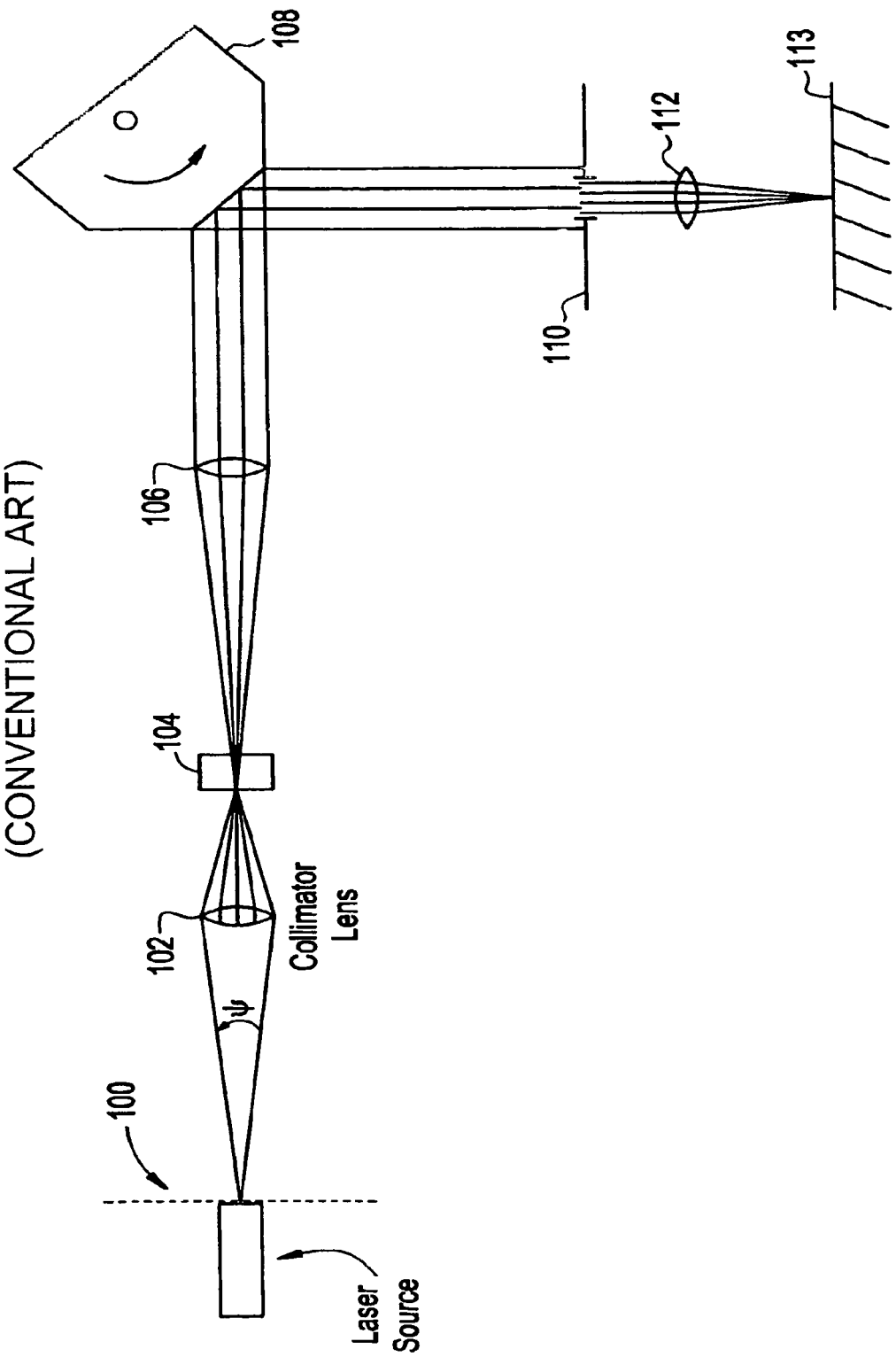
FIG. 1 illustrates an example conventional patter generator in which one or more example embodiments of the present invention may be implemented.

FIG. 1 illustrates a conventional optical imaging system (e.g., a multiple beam raster scanning apparatus using incoherent light and/or immersion) in which one or more example embodiments of the present invention may be implemented. The pattern generator of FIG. 1 may include an electromagnetic radiation source, such as a laser, positioned at a focal plane 100, a collimator lens 102 to contract the light beams, a modulator 104 to produce the desired pattern to be written, a relay lens 106 to relay the modulated beam toward a reflecting mirror 108, which directs the beams towards a workpiece 113. An aperture 110 filters the reflected beam before the beam impinges on a second lens 112. The second lens 112 contracts the beams before they reach the substrate. The mirror 108 may be used for a scanning operation to sweep the beam along scan lines on the substrate. The first lens 102, the relay lens 106, the reflecting mirror 108, the aperture 110 and the second lens 112 may form an optical system.

Instead of a mirror, other scanning devices may be used, such as a rotating polygon, rotating prism, rotating hologram, an acousto-optic deflector, an electro-optic deflector, a galvanometer or any similar device. It is also possible to use raster scanning or spatial light modulators. Further, the substrate may be arranged on an object table which has motion in two orthogonal directions relative to the optical writing system, using, for example, two electrical servo motors.

Figure 2:
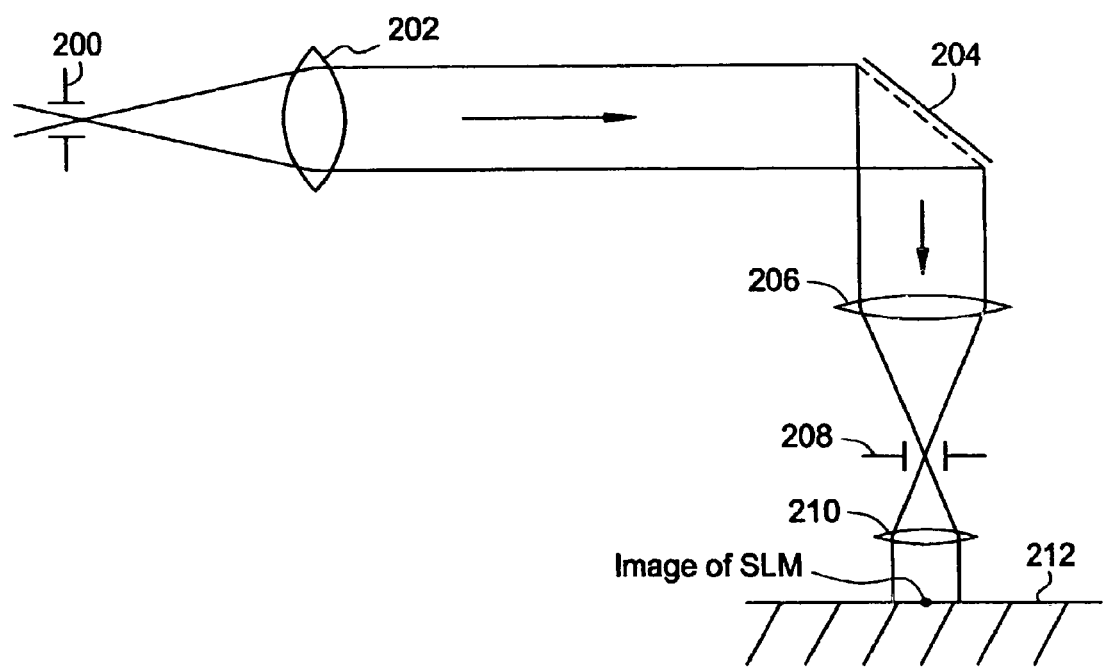
FIG. 2 illustrates another example conventional pattern generator in which one or more example embodiments of the present invention may be implemented.

FIG. 2 illustrates another conventional optical imaging system (e.g., a spatial light modulation-type pattern generator) in which one or more example embodiments of the present invention may be implemented. As shown in FIG. 2, the pattern generation apparatus may include an illuminator aperture 200 to filter electromagnetic radiation (e.g., a light beam) from an electromagnetic radiation source (e.g., an excimer laser, not shown). The filtered electromagnetic radiation may pass through a first lens 202 and then may be modulated into a desired pattern and relayed toward a workpiece 212 by a spatial light modulator (SLM) 204. The SLM 204 may be, for example, a reflective or transmissive liquid crystal display (LCD), may include rotating mirrors (e.g., digital or analog micromirrors), may include piston mirrors, may be a grating light valve (GLV) silicon light machine or any other suitable SLM. The modulated light may be condensed and focused by a second lens 206 filtered by another aperture 208 and relayed toward a portion of the workpiece 212 in order to generate an image on the workpiece by a third lens 210. In the system of FIG. 2, the illuminator aperture 200, the first lens 202, the SLM 204, the second lens 206, the aperture 208 and the third lens 210 may form an optical system.

As described herein, a workpiece may be, for example, a mask, a reticle substrate, a semiconductive substrate or any other suitable workpiece or substrate. The workpiece may also be at least partially transmissive or reflective.

Although example embodiments of the present invention will be described with regard to a refractive optical system, it will be understood that example embodiments of the present invention may be implemented in any suitable optical system. For example, example embodiments of the present invention may be implemented in an optical system including refractive and/or reflective optical elements.

An example embodiment of the present invention provides a method for determining an improved pupil function for an optical imaging system (e.g., a pattern generator). For the sake of brevity, example embodiments of the present invention will be described with regard to the conventional optical imaging systems as illustrated in FIGS. 1 and 2. However, it will be understood that example embodiments of the present invention may be used in conjunction with any suitable optical imaging system.

With regard to the optical imaging system of FIG. 1, a spatial light intensity distribution and/or CD linearity errors associated with the optical imaging systems may be determined by convolving a beam intensity at a focal plane of a lens. For example, the beam may have a Gaussian shape with a smaller non-monotonic shape added thereto (e.g., within a pupil of the optical imaging system) and may have a radially non-monotonic distribution including concentric rings with higher and lower intensities.

A complex pupil function $E_0(\rho)$), resulting from a light beam impinging on the collimator lens 102 may be correlated to an electric field vector $E(r,\psi)$ at the focal plane 100. For example, there may be a linear connection between $E_0(\rho)$ at the surface of the lens 102 and the electric field vector $E(r,\psi)$ at the focal plane 100. This linear connection may be given by equation 1 shown below.

$$E(r,\psi)=\int E_0(\rho)G(\rho,r,\psi)d\rho. \qquad (1)$$

In equation (1), r is the polar radius at the focal plane 100 and $\psi$ is the angle at the focal plane 100. $\rho$ is a radial coordinate at the surface of the lens (e.g., the lens radius) 102. In this example, axial symmetry is used for simplicity. $G(\rho,r,\psi)$ is a vector, which may be based on, for example, the polarization of the light emitted by the laser source, lens design and/or a light propagation model used within the optical imaging system of FIG. 1. The vector $G(\rho,r,\psi)$ may be proportional to a zero-order Bessel function of first kind in a paraxial approximation (e.g., $G(\rho,r,\psi) \sim \rho J_0(2\pi\rho r/(\lambda f))$. The product $E_0(\rho) G(\rho,r,\psi)$ may then be integrated with respect to $\rho$ over the surface of the lens 102 to generate the electric field vector $E(r,\psi)$ at the focal plane 100.

Using equation (1), a one dimensional field intensity $F(x)$ is given by equation (2):

$$F(x) = \int_{-\infty}^{+\infty} |E(r,\psi)|^2 dy = \int\int E_0(\rho)E_0^*(\tilde{\rho})\Omega(\rho,\tilde{\rho},x)d\rho d\tilde{\rho} \quad (2)$$

in which, $$\Omega(\rho,\tilde{\rho},x) = \int_{-\infty}^{+\infty} G(\rho,r,\psi)G^*(\tilde{\rho},r,\psi)dy.$$

The above equation (2) may be used to determine the CD linearity function for the optical imaging system of FIG. 1 using incoherent light. For the same optical imaging system of FIG. 1, a CD linearity error $\delta(a)$ as function of i-line width is the solution of equation (3) shown below:

$$F_a((a-\delta)/2) = \tfrac{1}{2} F_\infty. \quad (3)$$

In the above equation (3), $F_\infty$ is the intensity at a line of infinite width and $F_a(x)$ is the convolution of the one dimensional field intensity $F(x)$ and the i-line profile given by equation (4) shown below:

$$F_a(x) = \int_{-a/2}^{a/2} F(x-t)dt. \quad (4)$$

Reducing equations (3) and (4) to integral equation (5) (shown below), provides a connection between a desired (e.g., a target) CD 'a', CD linearity error $\delta$, and the one dimensional field intensity $F(x)$.

$$\int_{a-\delta/2}^{\infty} F(x)dx = \int_0^{\delta/2} F(x)dx. \quad (5)$$

Based on equation (5) above, assuming that $F(x)$ represents the convoluted intensity of the light beam emitted by the laser source, one can decipher that the one dimensional field intensity $F(x)$ (e.g., optimal distribution profile, $F(x)$) may be more compact at smaller x values and have smaller (e.g., negligible) side lobe magnitudes at larger x values.

In example embodiments of the present invention, equation (5) may be used to determine a CD value (e.g., minimum possible value) $a_{min}$ corresponding to an improved (e.g., optimized) pupil function $E_0(\rho)$ for a given CD linearity threshold error $\delta$.

An example method for determining this CD $a_{min}$ will be discussed in more detail below.

By substituting above equation (2), equation (5) may be rewritten as equation (6) shown below.

$$\iint E_0(\rho)E_0^*(\tilde{\rho})M(\rho,\tilde{\rho},a_{min})d\rho d\tilde{\rho}=0, \quad (6)$$

in which $M(\rho,\tilde{\rho},a)$ is a Hermitian matrix with values determined based on equation (6a).

$$M(\rho,\tilde{\rho},a) = \int_{a-\delta th/2}^{\infty} \Omega(\rho,\tilde{\rho},x)dx - \int_0^{\delta th/2} \Omega(\rho,\tilde{\rho},x)dx. \quad (6a)$$

In equation (6a), the Hermitian matrix $M(\rho,\tilde{\rho},a)$ may be positive for smaller CD values (e.g., $a \to 0$) and may be negative for larger CD values (e.g., $a \to \infty$).

Using equation (6), an improved (e.g., optimal) pupil function is the solution of an Eigenvalue problem for the linear integral equation (7):

$$\int E_0(\rho)M(\rho,\tilde{\rho},a_{min})d\rho=0, \forall\tilde{\rho}; \quad (7)$$

which computationally may be a system of linear equations.

For example, Eigenvectors at the root $a_{min}$ values of the Hermitian matrix $M(\rho,\tilde{\rho},a_{min})$ may represent a pupil function (e.g., an optimized pupil function or apodization) sufficient to optimize (e.g., maximize) a CD linearity for a printed image, created pattern, etc., according to example embodiments of the present invention.

Figure 3:
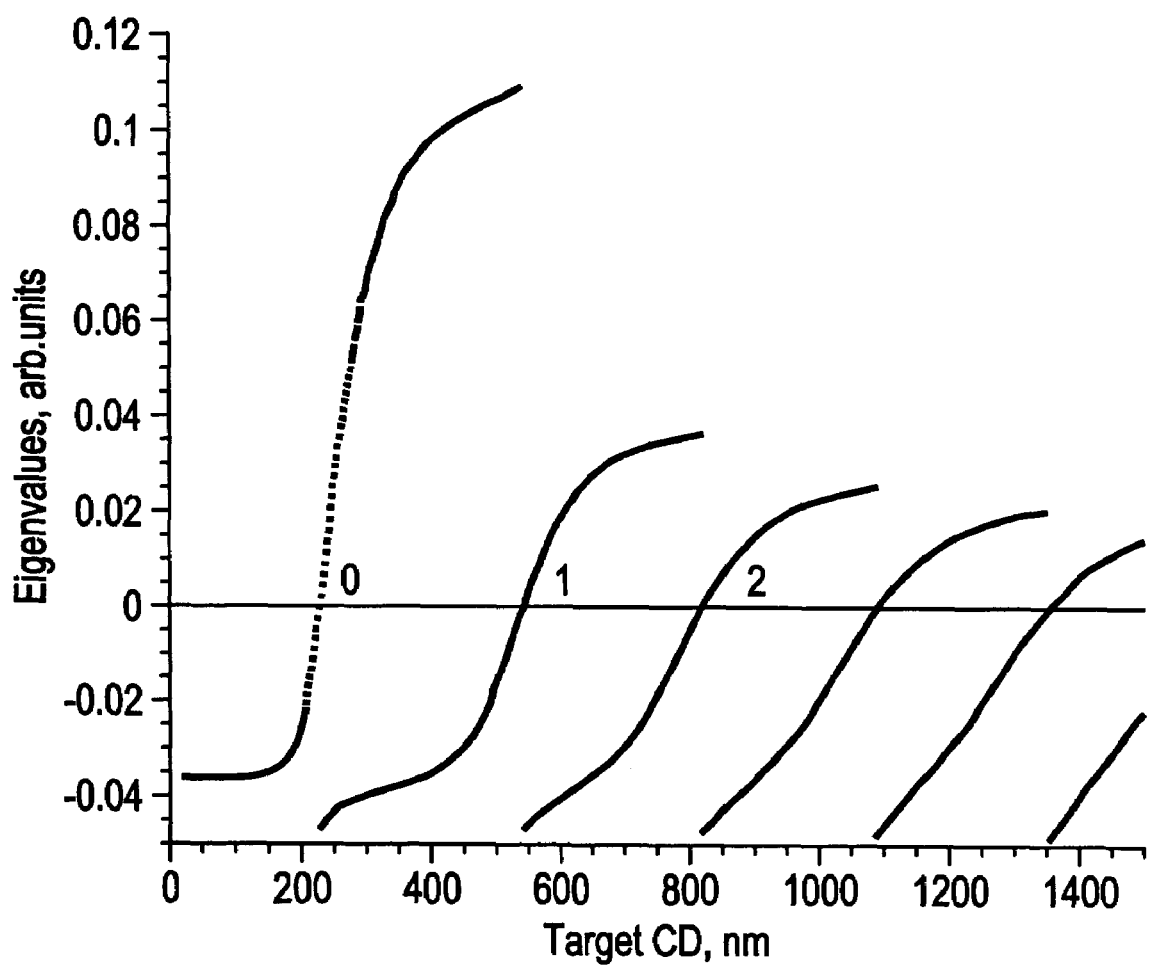
FIG. 3 is an example graph of Eigenvalues as a function of CD values according to example embodiments of the present invention.

FIG. 3 is a graph of Eigenvalues of the Hermitian matrix $M(\rho,\tilde{\rho},a)$ as a function of CD value a. The Eigenvalues of FIG. 3 were generated using a numerical aperture (NA) of about 0.86, a beam wavelength ($\lambda$) of about 413 nm, light having circular polarization and a 20 nm CD linearity error threshold. Thus, as shown in FIG. 3, an example of a smallest root $a_{min}$ CD value corresponding to an improved (e.g., optimized) pupil function given a CD linearity threshold of 20 nm is 226 nm.

In the graph shown in FIG. 3, the total number of Eigenbranches may be equal to the number of basic functions (e.g., linear equations) used to solve the above mentioned Eigenvalue problem.

Figure 4:
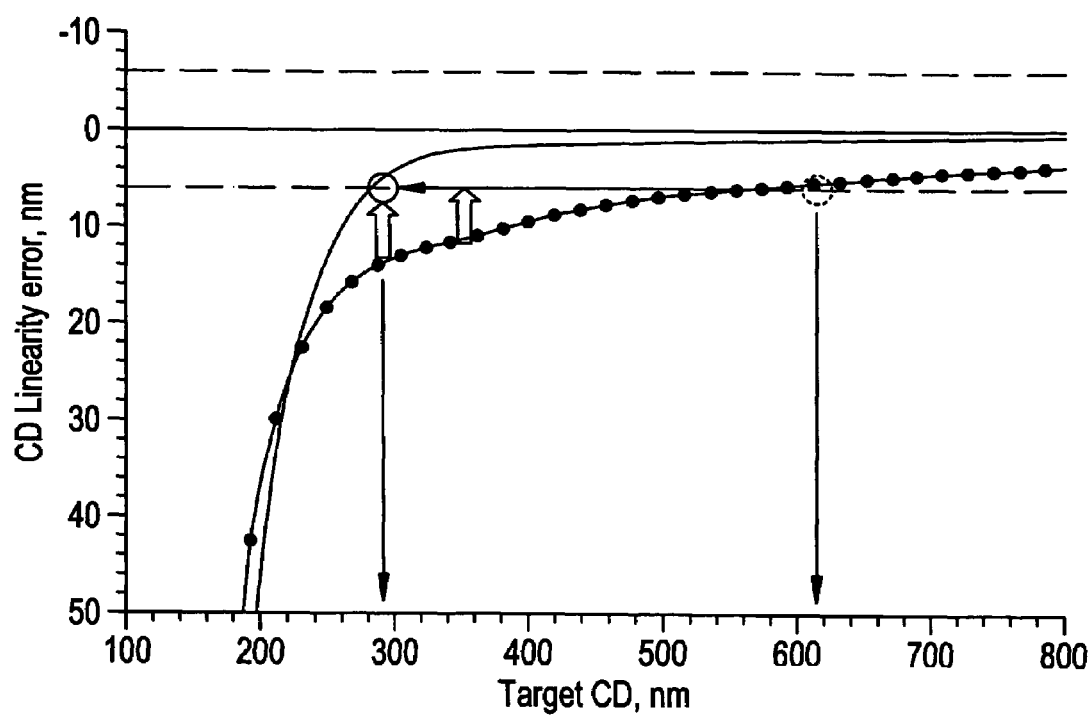
FIG. 4 is a graph illustrating an improved CD linearity profile according to example embodiments of the present invention.

FIG. 4 illustrates an example improved CD linearity profile, which may be achieved utilizing methods according to example embodiments of the present invention. In FIG. 4 dashed lines at ±5 nm represent a CD linearity error threshold. In example embodiments of the present invention, the point at which the CD linearity error reaches (or falls within) the error threshold (as indicated by the circle), may be indicative of a resolution of a printed image. The curve with dots illustrates conventional optical resolution with a smaller beam waist. The solid curve of FIG. 4 is the resultant CD linearity profile for a 5 nm CD linearity error threshold.

Figure 5:
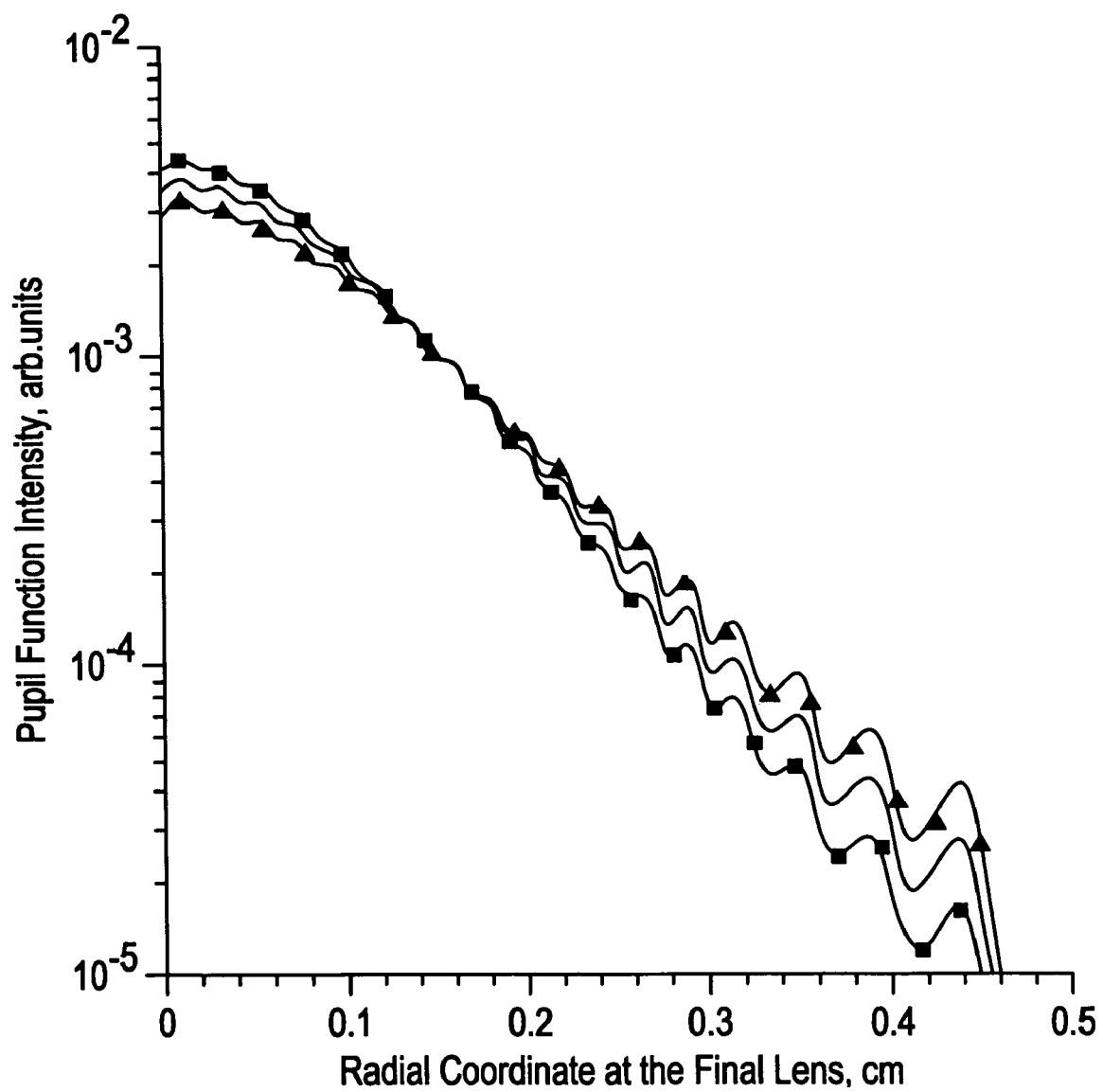
FIG. 5 is an example graph of pupil function intensity as a function of the radial coordinate at a final lens according to example embodiments of the present invention.

FIG. 5 illustrates pupil function intensity as a function of the radial coordinate (or lens radius) at, for example, the lens 102 of FIG. 1. As shown in FIG. 5, a smaller CD linearity error threshold (e.g., 10 mm) may require a more compact radial distribution of pupil function intensity and/or larger apodization.

Figure 6:
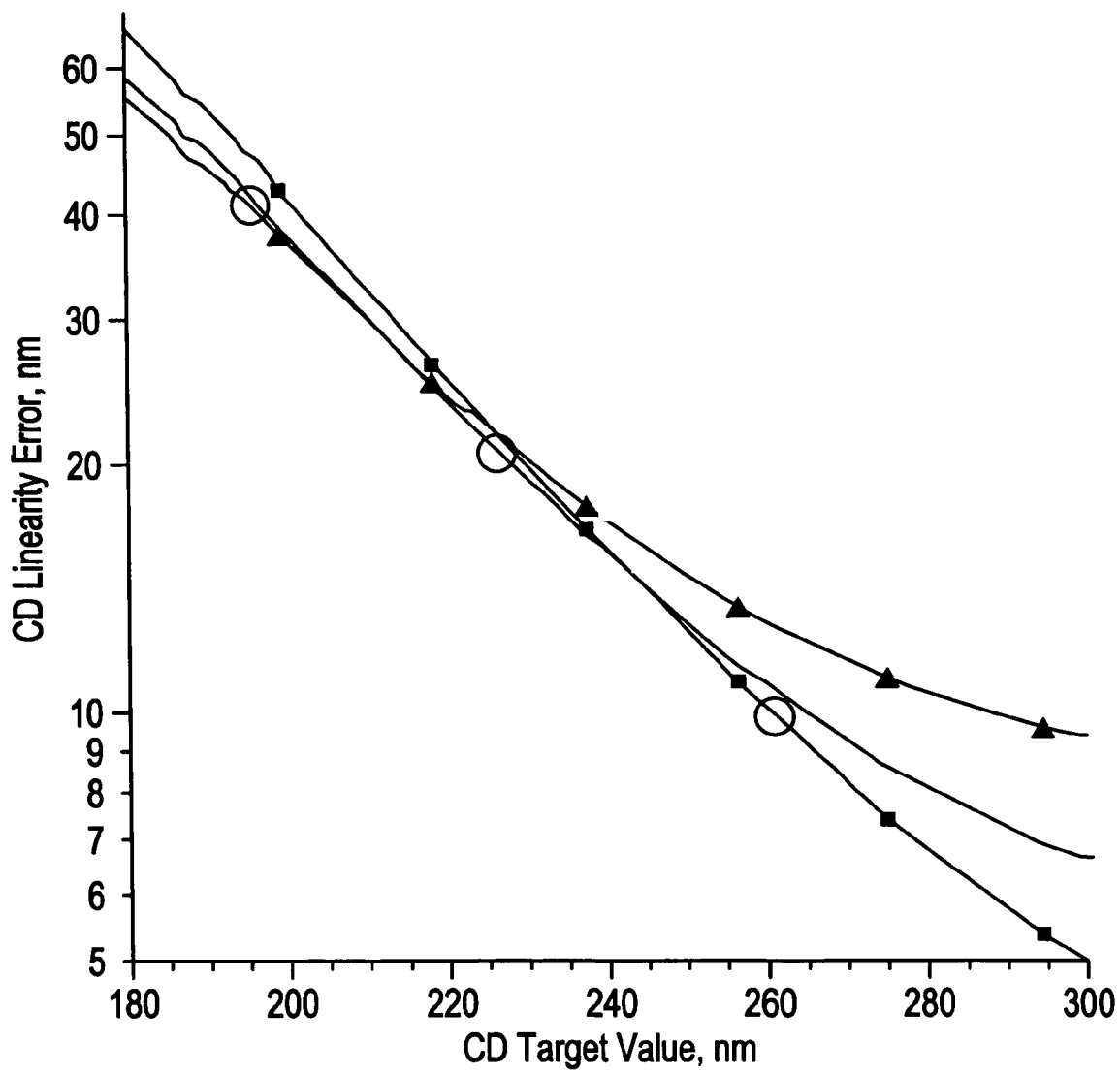
FIG. 6 is an example graph illustrating CD linearity profiles for several CD linearity error thresholds.

FIG. 6 illustrates resulting CD linearity profiles for 20 nm (solid curve), 40 nm (the curve with triangles) and 10 nm (the curve with squares) CD linearity error thresholds. Circles show the CD values, which may be used in order to achieve an improved (e.g., optimized) pupil function, according to example embodiments of the present invention. In example embodiments of the present invention, the CD and/or CD linearity error may be determined based on the wavelength of light $\lambda$ and the size of the NA used in an optical imaging system. For example, as shown in FIGS. 4 and/or 6, a CD linearity error may be equal to 0.0125*λ/NA or 0.02*λ/NA at a CD of about 0.63*λ/NA, 0.73*λ/NA and/or 0.83*λ/NA.

In example embodiments of the present invention, apodization may be achieved, for example, by introducing additional optical elements (e.g., lenses, filters, apertures, etc.) and/or by rearranging existing optical systems in order to achieve a desired result.

For example, with regard to the optical imaging system illustrated in FIG. 1, for example, the lens 102 may be shifted along an optical axis within the optical system in order to decrease the effective diameter of the light beam at the system aperture. This decrease in effective diameter of the light beam may result in the improved (e.g., optimized) pupil function for the optical imaging system of FIG. 1 and/or apodization of the light beam used to print an image.

With regard to the optical imaging system of FIG. 2, for example, the improved pupil function (apodization) may be achieved by introducing a pupil amplitude filter as an addition optical element in the optical system. Examples of this pupil amplitude filter are shown in FIGS. 7 and 8.

Figure 7:
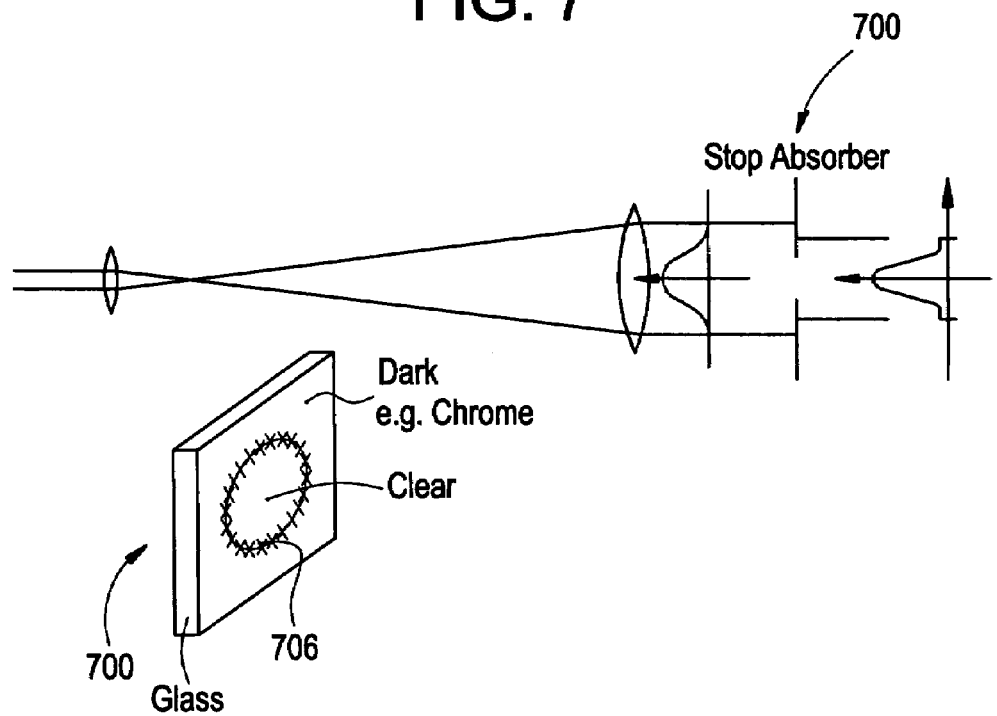
FIG. 7 is a pupil amplitude filter according to an example embodiment of the present invention.
Figure 8:
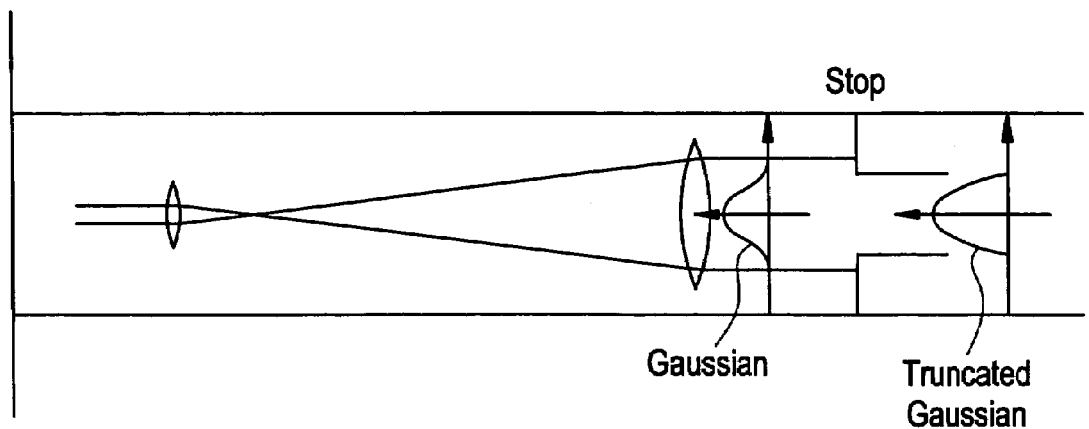
FIG. 8 is a pupil amplitude filter according to another example embodiment of the present invention.

FIG. 7 illustrates an aperture stop 700 according to an example embodiment of the present invention, which may decrease the effective diameter of the light beam at the system aperture. As shown in FIG. 7, the aperture stop 700 may be any suitable conventional aperture stop further including an absorber/scattering film (e.g., absorbing film, scattering film, etc.) 706, which may decrease the effective diameter of a light beam or beams, for example, by allowing the light beam or beams to pass through the clear portion, while scattering the portions of the light beam or beams impinging upon the absorber/scattering pattern 706. This decrease in effective diameter of the light beam may result in the improved (e.g., optimized) pupil function for the optical imaging system of FIG. 2 and/or apodization of the light beam used to print an image. FIG. 8 illustrates an aperture stop, which may also be used to decrease the effective diameter of the light beam at the system aperture. This decrease in effective diameter of the light beam may also result in the improved (e.g., optimized) pupil function for the optical imaging system of FIG. 2 and/or apodization of the light beam used to print the image. Each of the additional optical elements may be positioned at any aperture within the optical imaging system of FIG. 2 (e.g., the illuminator aperture 200 and/or the system aperture 210 of FIG. 2) and may provide a system aperture for creating a spot function with less than about 0.8% percent outside of a center lobe component of the electromagnetic radiation.

In example embodiments of the present invention, the light beam may have a beamwidth less than about 150 percent (e.g., less than about 75, 100 or 125 percent) of an aperture size of the system aperture, for example, the aperture stop 700 of FIG. 7. In another example, the light beam may have a beamwidth of less than about 0.3 times (e.g., less than about 0.15, 0.20, 0.25 or 0.30 times) an aperture size of the system aperture, for example, the aperture stop 700 of FIG. 7.

As noted above, although example embodiments of the present invention have been described with regard to FIGS. 1 and 2, it will be understood that example embodiments of the present invention may be utilized in conjunction with and/or implemented in any suitable pattern generator, for example, as illustrated in U.S. Pat. Nos. 5,635,976, 5,495,279 and PCT International Publication No. WO 98/33096, the entire contents of which are incorporated herein by reference.

Example embodiments of the present invention have been described with regard to a laser source (e.g., an excimer laser source). However, it will be understood that any suitable electromagnetic radiation source or laser source (e.g., pulsed or otherwise) may be used.

Example embodiments of the present invention provide a non-iterative and non-parametric pupil function improvement (e.g., optimization) for improving a CD linearity profile for incoherent optical imaging systems. With the improved pupil apodization, according to example embodiments of the present invention, CD linearity and/or depth of focus for an optical imaging system may be improved.

In an example embodiment using a higher NA, a loss of edge acuity may be suppressed and/or corner radius performance may be improved due to, for example, greater apodization.

One or more pattern generators and/or methods, according to example embodiments of the present invention, may be capable of writing sub-0.25 micron lines and/or spaces, and/or produce an integrated circuit (e.g., a processor a memory, etc.) with a pattern having a line width less than 0.25 microns. In one or more example embodiments of the present invention, the pattern may be produced by applying an apodized intensity of electromagnetic radiation, for example, after a system aperture in an optical path of a pattern generator, and creating a spot function with less than 0.8% percent outside of a center lobe.

Example embodiments of the present invention being thus described, it will be obvious that the same may be varied in many ways. Such variations are not to be regarded as a departure from the invention, and all such modifications are intended to be included within the scope of the invention.

We claim:

1. A pattern generator comprising:
   an electromagnetic radiation source for emitting electromagnetic radiation to create a pattern on a workpiece; and
   an optical system including an optical path for the electromagnetic radiation emitted from the electromagnetic radiation source; wherein
   the optical system is configured such that an apodization of the electromagnetic radiation is sufficient to optimize a critical dimension linearity for the created pattern, and
   the apodized electromagnetic radiation has a Gaussian shape.

2. The pattern generator of claim 1, wherein the optical system is a partially incoherent imaging system.

3. The pattern generator of claim 2, wherein the partially incoherent imaging system uses immersion.

4. The pattern generator of claim 2, wherein the partially incoherent imaging system has multiple raster-scanning beams.

5. The pattern generator of claim 1, wherein the optical system further includes a system aperture for creating a spot function with less than 2 percent outside of a center lobe component of the electromagnetic radiation.

6. The pattern generator of claim 1, wherein the optical system further includes a system aperture having a numerical aperture and a critical dimension and critical dimension linearity error for the pattern generator is determined based on the wavelength of the electromagnetic radiation and a size of the numerical aperture.

7. The pattern generator of claim 1, wherein the electromagnetic radiation is a light beam with a polarization that varies across an exit pupil.

8. The pattern generator of claim 7, wherein the modulator is one of an acousto-optical or electro-optical modulator.

9. The pattern generator of claim 8, wherein the optical system further includes a filter for filtering the electromagnetic radiation such that the apodization of the electromagnetic radiation is sufficient to optimize a critical dimension linearity for the created pattern.

10. The pattern generator of claim 9, wherein the filter is an amplitude pupil filter having an aperture size determined based on a wavelength of the light beam.

11. The pattern generator of claim 9, wherein the light beam has a wavelength of about 413 nm, about 406 nm, about 364 nm, about 257 nm, about 198 nm or about 193 nm.

12. The pattern generator of claim 9, wherein the light beam has a wavelength greater than, or equal to, about 32 nm.

13. The pattern generator of claim 1, wherein the optical system further includes,
  a first lens positioned such that an apodization of the electromagnetic radiation is sufficient to optimize a critical dimension linearity for the created pattern,
  a modulator modulating electromagnetic radiation emitted from the electromagnetic radiation source to create a pattern,
  a scanner for relaying the electromagnetic radiation toward the workpiece, and
  a second lens for focusing the electromagnetic radiation such that the electromagnetic radiation impinges on the workpiece to create the pattern.

14. The pattern generator of claim 13, wherein the light beam has a radially non-monotonic distribution within a pupil of the optical imaging system.

15. The pattern generator of claim 14, wherein the radially non-monotonic distribution includes concentric rings having higher and lower intensities.

16. The pattern generator of claim 13, wherein the light beam has a wavelength greater than, or equal to, about 32 nm.

17. The pattern generator of claim 13, wherein the light beam has a wavelength of about 413 nm, about 406 nm, about 364 nm, about 257 nm, about 198 nm or about 193 nm.

18. The pattern generator of claim 1, wherein the optical system further includes a spatial light modulator having a plurality of pixels for creating a pattern and for relaying electromagnetic radiation such that the electromagnetic radiation impinges on the workpiece.

19. The pattern generator of claim 18, wherein the electromagnetic radiation is a light beam.

20. The pattern generator of claim 19, wherein the light beam has a beamwidth, which is less than about 0.3 times the aperture size.

21. The pattern generator of claim 1, wherein the electromagnetic radiation is a light beam.

22. An integrated circuit comprising:
  a pattern having a line width less than 0.25 microns, the pattern being produced using the pattern generator of claim 1.

23. The pattern generator of claim 1, wherein said apodization of the electromagnetic radiation is applied after a system aperture in the optical path of the patent generator.

24. The pattern generator of claim 1, wherein said apodization is creating a spot function with less than 0.8 percent outside of a center lobe.

25. The pattern generator of claim 1, wherein said apodization is achieved by introducing at least one additional optical element.

26. The pattern generator of claim 1, wherein said at least one additional optical element is one of a lens, a filter or an aperture.

27. The pattern generator of claim 1, wherein said apodization is achieved by rearranging existing optical elements.

28. The pattern generator of claim 1, wherein the optical system further includes a system aperture having an aperture size providing an apodization sufficient to minimize the smallest line width satisfying plus/minus 40 nm CD linearity error.

29. The patent generator of claim 1, wherein the optical system further includes a system aperture having an aperture size providing an apodization sufficient to minimize the smallest line width satisfying plus/minus 20 nm CD linearity error.

30. The pattern generator of claim 1, wherein the optical system further includes a system aperture having an aperture size providing an apodization sufficient to minimize the smallest line width satisfying plus/minus 10 nm CD linearity error.

31. The pattern generator of claim 1, wherein the optical system further includes a system aperture having an aperture size providing an apodization sufficient to minimize the smallest line width satisfying plus/minus 5 nm CD linearity error.

32. A pattern generator comprising:
  an electromagnetic radiation source for emitting electromagnetic radiation to create a pattern on a workpiece; and
  an optical system including an optical path for the electromagnetic radiation emitted from the electromagnetic radiation source; wherein
    the optical system is configured such that an apodization of the electromagnetic radiation is sufficient to optimize a critical dimension linearity for the created pattern, and
    the optical system further includes a system aperture for creating a spot function with less than 0.8% percent outside of a center lobe component of the electromagnetic radiation.

33. The pattern generator of claim 32, wherein the system aperture has a numerical aperture greater than or equal to about 0.68.

* * * * *